United States Patent
Lin et al.

(10) Patent No.: US 8,696,282 B2
(45) Date of Patent: Apr. 15, 2014

(54) CANTILEVER-TYPE STANDOFF

(75) Inventors: Hung-Pin Lin, Taipei (TW); Pin-Cheng Chen, Taipei (TW); Meng-Hsin Tsai, Taipei (TW); Cheng-Hsin Chen, Taipei (TW); Shih-Jung Huang, Taipei (TW)

(73) Assignee: Inventec Corporation, Taipei (TW)

( * ) Notice: Subject to any disclaimer, the term of this patent is extended or adjusted under 35 U.S.C. 154(b) by 216 days.

(21) Appl. No.: 13/351,234

(22) Filed: Jan. 17, 2012

(65) Prior Publication Data

US 2013/0140253 A1 Jun. 6, 2013

(30) Foreign Application Priority Data

Dec. 2, 2011 (TW) ................ 100144372 A (51) Int. Cl.
*F16B 21/00* (2006.01)

(52) U.S. Cl.
USPC ........................................................ 411/349

(58) Field of Classification Search
USPC ............... 411/348, 349, 350; 211/41.1, 41.17
See application file for complete search history.

(56) References Cited

U.S. PATENT DOCUMENTS

| 3,733,655 | A |   | 5/1973  | Kolibar   |           |
|-----------|---|---|---------|-----------|-----------|
| 3,777,052 | A | * | 12/1973 | Fegen     | 174/138 D |
| 4,495,380 | A | * | 1/1985  | Ryan et al. | 174/138 D |
| 4,969,065 | A | * | 11/1990 | Petri     | 361/804   |

FOREIGN PATENT DOCUMENTS

| EP | 2254398 A2 | 11/2010 |
| TW | M304187    | 1/2007  |
| TW | M328757    | 3/2008  |
| TW | M332139    | 5/2008  |
| TW | I311455    | 6/2009  |
| TW | M415624    | 11/2011 |

* cited by examiner

*Primary Examiner* — Roberta Delisle
(74) *Attorney, Agent, or Firm* — CKC & Partners Co., Ltd.

(57) ABSTRACT

A cantilever-type standoff includes a column body, a plurality of cantilevers, a plurality of blocking plates, and a plurality of bumps. The cantilevers are respectively disposed on opposite end surfaces of the column body. The blocking plates are respectively parallel to the cantilevers. A plurality of clamping grooves are respectively defined by the blocking plates and the cantilevers. The bumps are respectively disposed on surfaces of the cantilevers facing the blocking plates.

15 Claims, 10 Drawing Sheets

CANTILEVER-TYPE STANDOFF

RELATED APPLICATIONS

This application claims priority to Taiwan Application Serial Number 100144372, filed Dec. 2, 2011, which is herein incorporated by reference.

BACKGROUND

1. Field of Invention

The present invention relates to a standoff. More particularly, the present invention relates to a cantilever-type standoff and a system thereof.

2. Description of Related Art

With the increasingly rapid development of science and technology, various electronic devices have been widely applied in our daily life. These electronic devices typically have circuit boards disposed therein for installing electronic elements. To protect the electronic elements, the stability of the circuit boards is of great importance.

In general, for an existing standoff of the circuit board, the two upper and lower circuit boards are often locked through components such as a screw or a bolt if it is wanted to secure the circuit board. However, when a user disassembles the circuit board, the screw or bolt is often lost due to inconvenient storage, such that the circuit board cannot be assembled back, which is really inconvenient for a user. Moreover, either for the screw or for the bolt, the user can only disassemble the circuit board through a special tool. Thus, if the user takes along no usable tool, the circuit board cannot be disassembled, which is also very inconvenient.

Moreover, if it is wanted to secure more than three circuit boards, additional standoffs should be added for supporting and securing. In addition to increasing the number of elements, the operation time and the cost are also increased correspondingly.

Thus, for the existing standoff of the circuit board, there are still some problems and challenges to overcome.

SUMMARY

In view of the above, a technical aspect of the present invention provides a cantilever-type standoff which can secure multiple substances to be secured (e.g., a circuit board), for overcoming the problems existing in the prior art mentioned above.

The present invention uses only a single standoff to simultaneously secure a plurality of substances to be secured, for reducing the cost and increasing the working efficiency.

The present invention provides a cantilever-type standoff. According to an embodiment of the present invention, the cantilever-type standoff includes a column body, a plurality of cantilevers, a plurality of blocking plates and a plurality of bumps. The cantilevers are respectively disposed on opposite end surfaces of the column body. The blocking plates are respectively parallel to the cantilevers. A plurality of clamping grooves are respectively defined by the blocking plates and the cantilevers. The bumps are respectively disposed on a plurality of surfaces of the cantilevers facing the blocking plates.

In some embodiments, the cantilever is formed by elastic materials. In some embodiments, the cantilever-type standoff may include a plurality of extension arms and a plurality of bumps. The extension arms are extended from the cantilevers mentioned above. A plurality of surfaces of the extension arms facing the blocking plates have a plurality of bumps. In some embodiments, the extension arm and the cantilever have the equal length. In some embodiments, the cantilever-type standoff may include a notch groove formed on one of the cantilevers.

In some embodiments, the cantilever-type standoff may include at least one middle cantilever, at least one middle blocking plate and at least one middle bump. The middle cantilever is disposed between the blocking plates. The middle blocking plate is disposed below the middle cantilever. At least one middle clamping groove is defined jointly by the middle blocking plate and the middle cantilever, for clamping at least one middle substance to be secured. The middle bump is disposed on a surface of the middle cantilever facing the middle blocking plate. In some embodiments, the middle cantilever is formed by elastic materials.

Another aspect of the present invention provides a cantilever-type standoff system which includes a cantilever-type standoff described above and a plurality of substances to be secured. The substance to be secured is clamped by the clamping groove, and the substance to be secured includes a bump hole and a cantilever hole. The bump hole has a size approximately equal to the same of the bump. The cantilever hole has a size slightly larger than the same of the cantilever.

Another aspect of the present invention provides a cantilever-type standoff system which includes a cantilever-type standoff described above, a plurality of substances to be secured and at least one middle substance to be secured. The substance to be secured is clamped by the clamping groove, and the substance to be secured includes a bump hole and a cantilever hole. The middle substance to be secured is clamped by a middle clamping groove, and the middle substance to be secured includes a middle bump hole and a middle cantilever hole. The bump hole mentioned above has a size approximately equal to the same of the bump. The cantilever hole has a size slightly larger than the same of the cantilever. The middle bump hole mentioned above has a size approximately equal to the same of the middle bump. The middle cantilever hole mentioned above has a size slightly larger than the same of the middle cantilever. The middle cantilever hole has a size larger than the same of the blocking plates but smaller than the same of the middle blocking plate.

Through the technical means above, the cantilever-type standoff provided by the present invention can use a plurality of clamping grooves and a plurality of bumps to jointly secure a plurality of substances to be secured, without using any component such as a screw or a bolt. Moreover, since the cantilevers are all connected with the column body, all cantilevers can co-rotate simultaneously along with the rotation of the column body or any cantilever, thereby realizing the effect of simultaneously securing multiple substances to be secured.

The foregoing has been presented only to explain aspects of the present invention, technical manner to realize the aspects and the resulting effects of the aspects, and specific details of the present invention are described in details through the embodiments and accompanying drawings below.

BRIEF DESCRIPTION OF THE DRAWINGS

In order to make the foregoing as well as other aspects, features, advantages, and embodiments of the present invention more apparent, the accompanying drawings are described as follows.

DETAILED DESCRIPTION

A plurality of embodiments of the present invention are disclosed with reference to the accompanying drawings. For clarity, many details in practice will also be illustrated in the following descriptions. However, it should be understood that the details in practice are not used to limit the present invention. That is to say, these details are not necessary in some embodiments of the present invention. Furthermore, for simplicity, some conventional structures and elements are illustrated in a simple and schematic way in the drawings.

Figure 1:
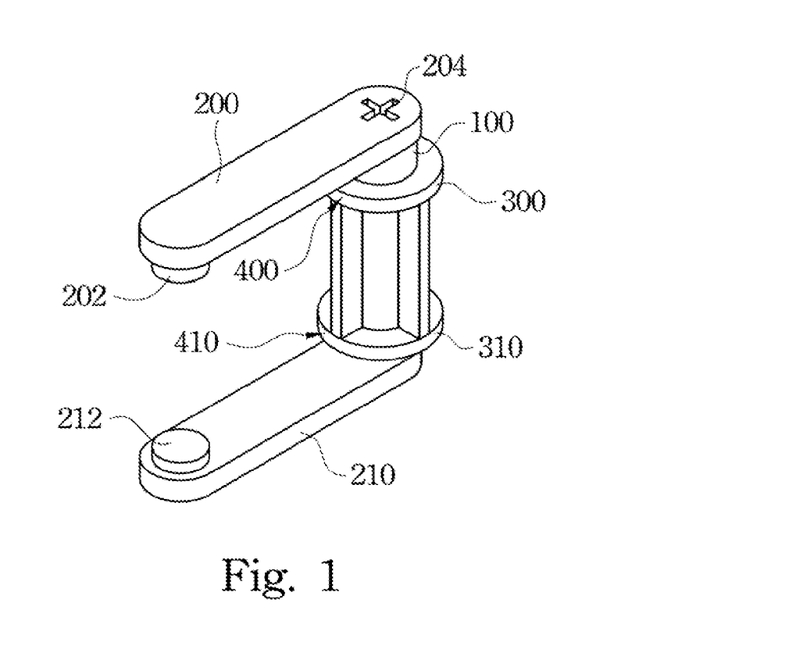
FIG. 1 illustrates a perspective view of a cantilever-type standoff according to an embodiment of the present invention.

FIG. 1 illustrates a perspective view of a cantilever-type standoff according to an embodiment of the present invention. As shown in FIG. 1, this cantilever-type standoff includes a column body 100, cantilevers 200 and 210, blocking plates 300 and 310, and bumps 202 and 212. The cantilevers 200 and 210 are respectively disposed on opposite end surfaces of the column body 100. The blocking plates 300 and 310 are parallel to the cantilevers 200 and 210. A clamping groove 400 is defined jointly by the blocking plate 300 and the cantilever 200. Similarly, a clamping groove 410 is defined jointly by the blocking plate 310 and the cantilever 210. The clamping groove 400 and the clamping groove 410 are respectively used for clamping at least one substance to be secured. The bump 202 is disposed on a surface of the cantilever 200 facing the blocking plate 300. Similarly, the bump 212 is disposed on a surface of the cantilever 210 facing the blocking plate 310.

Thus, the cantilever-type standoff provided by this embodiment can use the clamping grooves 400 and 410 and the bumps 202 and 212 to jointly secure at least two substances to be secured (e.g., a circuit board), without using any component such as a screw or a bolt. Moreover, since the cantilever 200 and the cantilevers 210 are both connected with the column body 100, all cantilevers (including the cantilever 200 and the cantilevers 210) can co-rotate simultaneously along with the rotation of the column body 100, the cantilever 200 or the cantilever 210, thereby realizing the effect of simultaneously securing multiple substances to be secured.

Figure 2:
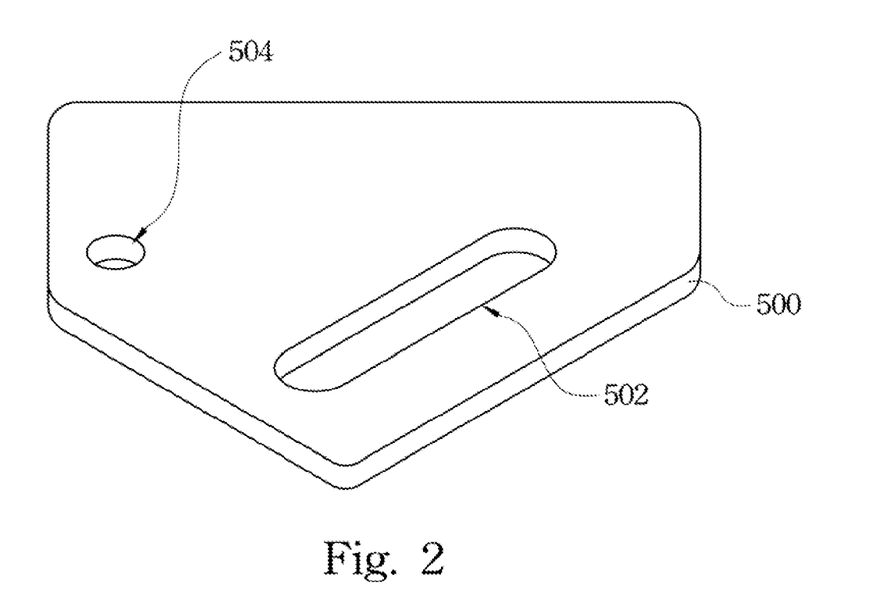
FIG. 2 illustrates a perspective view of a substance to be secured according to an embodiment of the present invention.

FIG. 2 illustrates a perspective view of a substance to be secured according to an embodiment of the present invention. As shown in FIG. 2, the substance to be secured 500 may be provided with a cantilever hole 502 and a bump hole 504. The cantilever hole 502 is arranged corresponding to the cantilever 200. The bump hole 504 is arranged corresponding to the bump 202. In some embodiments, the cantilever hole 502 has a size slightly larger than the same of the cantilever 200 (referring to FIG. 1), such that the cantilever 200 can thread through the cantilever hole 502, so as to relatively support the substance to be secured 500 on the blocking plate 300. In some embodiments, the bump hole 504 has a size approximately equal to the same of the bump 202 (referring to FIG. 1), such that the bump 202 can be engaged in the bump hole 504, for helping securing the substance to be secured 500. In some embodiments, the distance between the cantilever 200 and the blocking plate 300 is approximately equal to the thickness of the substance to be secured 500, for helping clamping the substance to be secured 500.

Figure 3:
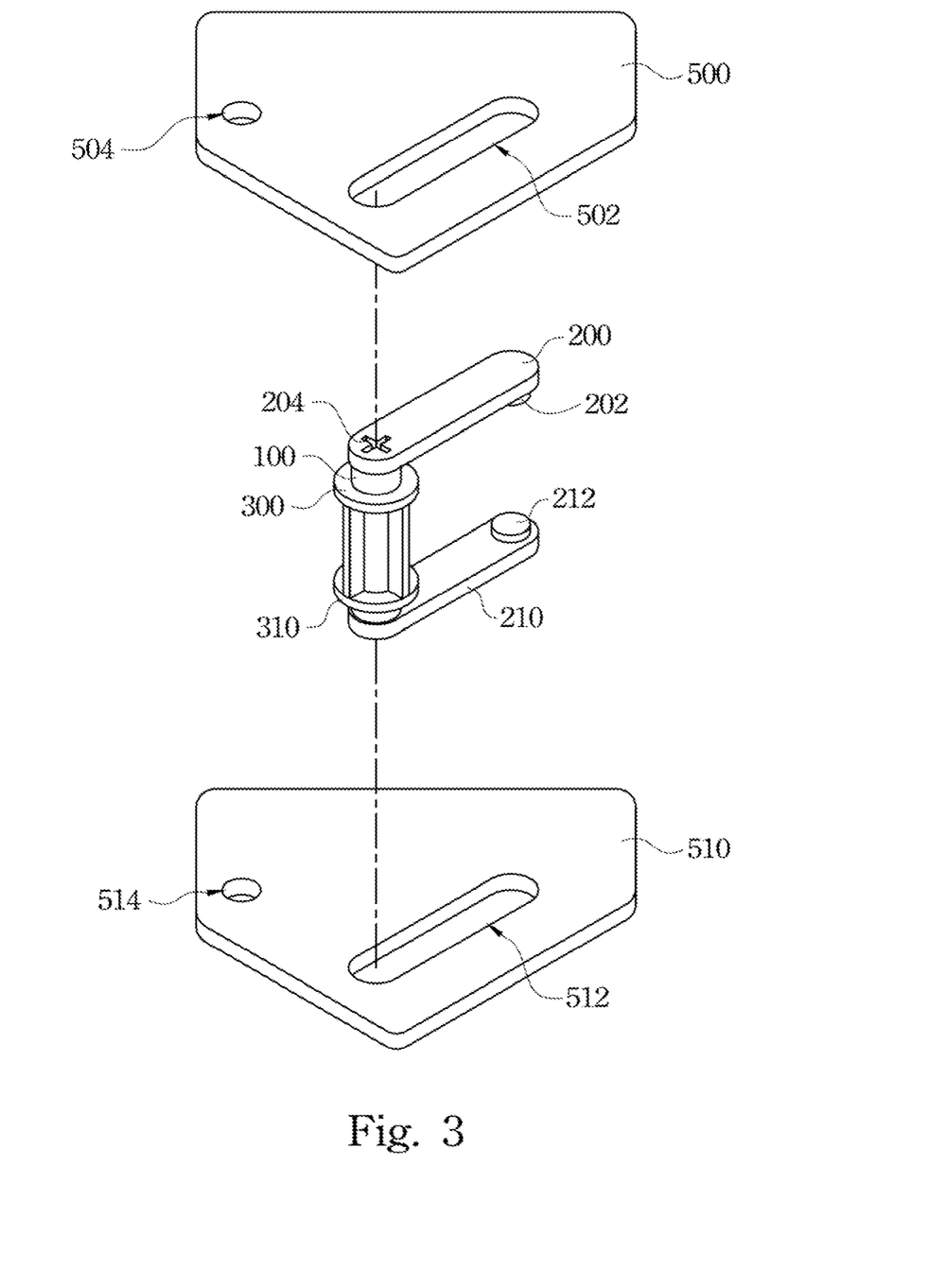
FIGS. 3-5 illustrate perspective views of an operation process of the cantilever-type standoff system according to an embodiment of the present invention.
Figure 4:
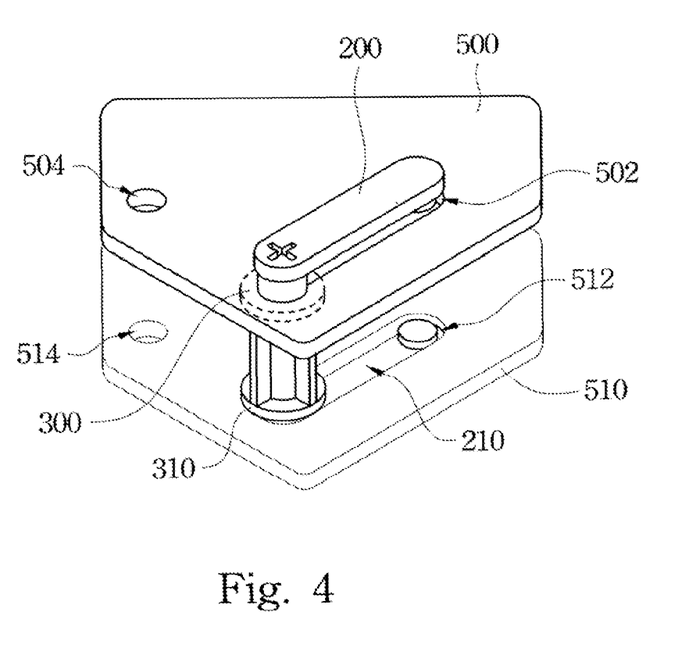
Figure 5:
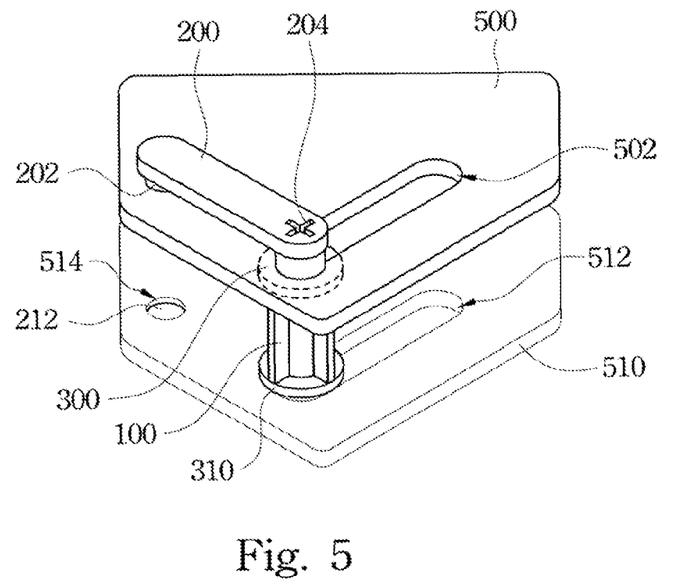

FIGS. 3-5 illustrate perspective views of an operation process of the cantilever-type standoff system according to an embodiment of the present invention. The cantilever-type standoff system provided by this embodiment can be used for securing at least two substances to be secured 500 and 510. Similar to the substance to be secured 500 of FIG. 2, the substance to be secured 510 may be provided with a cantilever hole 512 and a bump hole 514. The cantilever hole 512 is arranged corresponding to the cantilever 210. The bump hole 514 is arranged corresponding to the bump 212.

In sum, in the operation process provided by this embodiment, the bumps 202 and 212 respectively move from the cantilever holes 502 and 512 to the bump holes 504 and 514 mainly by pulling the cantilevers 200 and/or 210.

As shown in FIG. 3, the cantilever hole 502 of the substance to be secured 500 may be aligned with the cantilever 200 and move towards the cantilever 200, or the cantilever 200 may move towards the cantilever hole 502. Similarly, the cantilever hole 512 of the substance to be secured 510 may be aligned with the cantilever 210 and move towards the cantilever 210, or the cantilever 210 may move towards the cantilever hole 512.

As shown in FIG. 4, the substance to be secured 500 may encircle the cantilever 200 through the cantilever hole 502 and be blocked at the blocking plate 300. Similarly, the substance to be secured 510 may encircle the cantilever 210 through the cantilever hole 512 and be blocked at the blocking plate 310. In some embodiments, the blocking plate 300 may have a size larger than the same of the cantilever hole 502, for blocking the substance to be secured 500 from moving downward continually. Similarly, in some embodiments, the blocking plate 310 may have a size larger than the same of the cantilever hole 512, for blocking the substance to be secured 510 from moving upward continually. For example, the blocking plates 300 and 310 may be but not limited to circular plates. The cantilever holes 502 and 512 may be but not limited to strip-shaped holes. The diameter of the blocking plates 300 and 310 may be larger than the width of the cantilever holes 502 and 512, such that the substances to be secured 500 and 510 can be blocked at the blocking plates 300 and 310.

As shown in FIG. 5, in this embodiment, a force can be applied on the cantilever 200 to make the cantilever 200 rotate, and thus the cantilever 210 connected with the column body 100 rotates at the same time along with the rotation of the cantilever 200, such that the bump 202 (referring to FIG. 3) and the bump 212 respectively move from the cantilever holes 502 and 512 to the bump hole 504 (referring to FIG. 4) and the bump hole 514, and thus the bumps 202 and 212 are respectively engaged in the bump holes 504 and 514, thereby simultaneously securing the substances to be secured 500 and 510. In particular, the cantilevers 200 and 210 can be made of elastic materials. Thus, when the cantilever 200 suffers from a force towards the bump hole 504, the bump 202 moves away from the cantilever hole 502 due to the elasticity of the cantilever 200 and slides along the surface of the substance to be secured 500 until touching the bump hole 504. Subsequently the bump 202 naturally falls into and is engaged in the bump hole 504 due to the elasticity of the cantilever 200. Meanwhile, due to co-rotation of the cantilever 210 and the cantilever 200, the bump 212 is also engaged in the bump hole 514 at the same time, thereby realizing the performance of co-securing.

Figure 6:
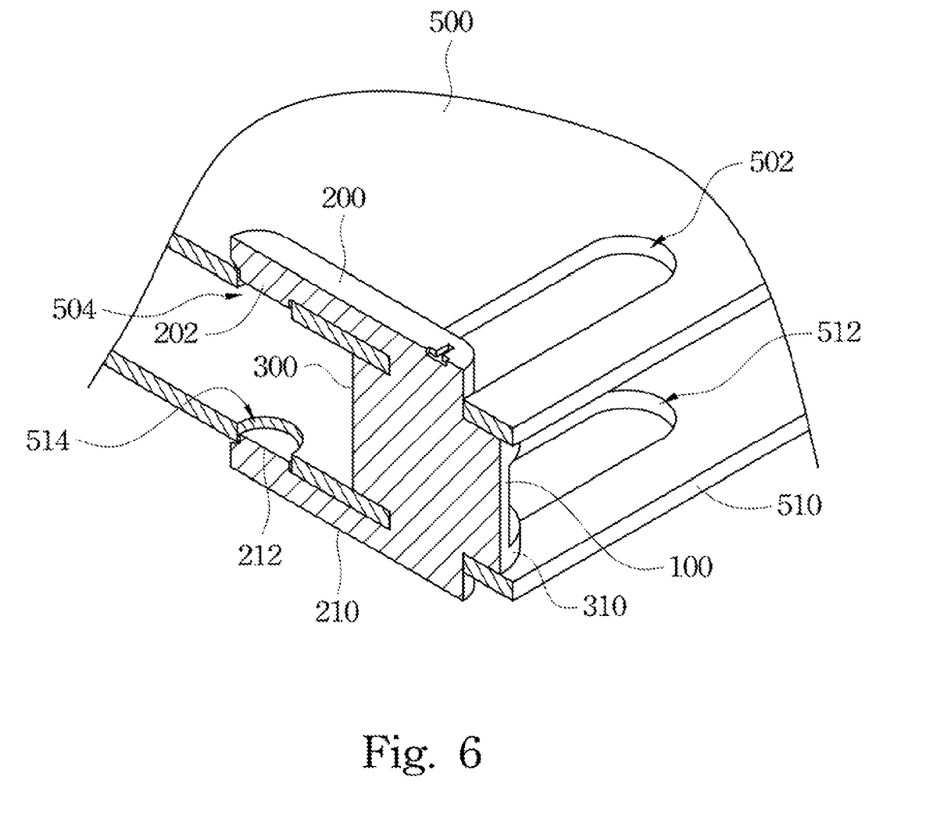
FIG. 6 illustrates a sectional view of the cantilever-type standoff system of FIG. 1 after a substance to be secured is secured thereby.

FIG. 6 illustrates a sectional view of the cantilever-type standoff system of FIG. 5 after a substance to be secured is secured thereby. As shown in FIG. 6, after the securation is completed, a surface of the substance to be secured 500 is pressed by the cantilever 200, and the other surface thereof is supported on the blocking plate 300. The end surface of the substance to be secured 500 is abutted against the column body 100. The end surface mentioned above is a surface adjacent to the upper and lower surfaces. The bump 202 is engaged in the bump hole 504. Thus, the substance to be secured 500 can be steadily secured between the column body 100, the cantilever 200 and the blocking plate 300. Similarly, the upper and lower surfaces of the substance to be secured 510 are separately clamped between the cantilever 210 and the blocking plate 310, and the end surface adjacent to the upper and lower surfaces is abutted against the column body 100. Thus, the substance to be secured 510 can be steadily secured between the column body 100, the cantilever 210 and the blocking plate 310.

In this embodiment, one side of the cantilever 200 far away from the bump 202 is aligned with the end surface of the column body 100. In some embodiments, the cantilever-type standoff may further include a notch groove 204 formed on the cantilever 200 corresponding to the end surface of the column body 100. In particular, the shape of the notch groove 204 can match with an external tool (such as a screw driver or a hexagon wrench). For example, the notch groove 204 may have a cross shape, such that the end of a screw driver can be inserted into and rotate in the notch groove 204 correspondingly. Thus, a user can use an external tool to rotate the cantilever 200, such that the bumps 202 and 212 rotate and are engaged in the bump holes 504 and 514.

Figure 7:
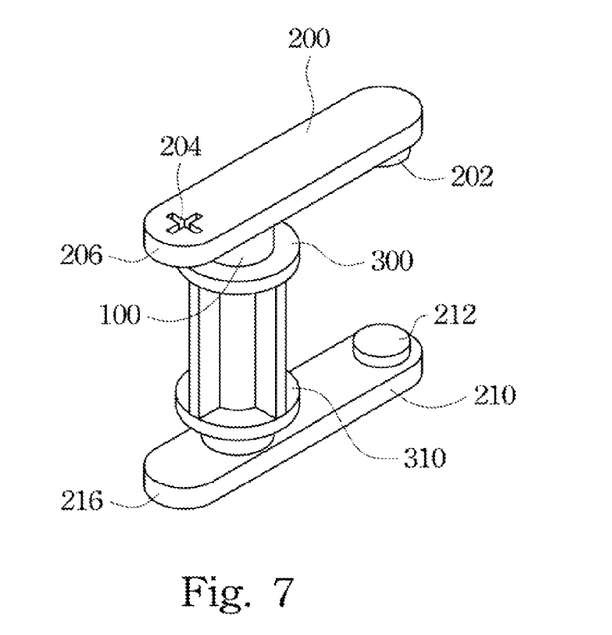
FIG. 7 illustrates a perspective view of a cantilever-type standoff according to another embodiment of the present invention.

FIG. 7 illustrates a perspective view of a cantilever-type standoff according to another embodiment of the present invention. As shown in FIG. 7, the largest difference between this embodiment and FIG. 1 is that this embodiment further includes extension arms 206 and 216. The extension arms 206 and 216 separately extend from the cantilevers 200 and 210 and can be used for clamping the substance to be secured (not shown) together with the blocking plate 300 or 310, thereby further improving the steadiness of securing.

Figure 8:
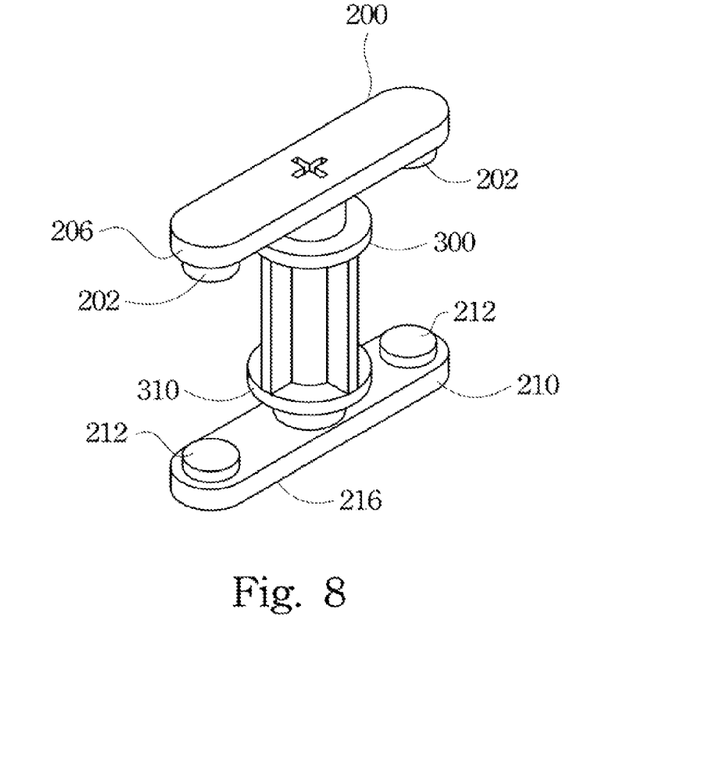
FIG. 8 illustrates a perspective view of a cantilever-type standoff according to still another embodiment of the present invention.

FIG. 8 illustrates a perspective view of a cantilever-type standoff according to still another embodiment of the present invention. As shown in FIG. 8, the largest difference between this embodiment and FIG. 7 is that the extension arm 206 includes the bump 202 disposed facing. the blocking plate 300. Similarly, the extension arm 216 has the bump 212 disposed facing the blocking plate 310. In this embodiment, the substance to be secured (not shown) may also be provided with additional bump holes corresponding to the bumps 202 and 212 of the extension arm 206 and the extension arm 216. Thus, the steadiness between the substance to be secured and the cantilever-type standoff can be further improved.

Figure 9:
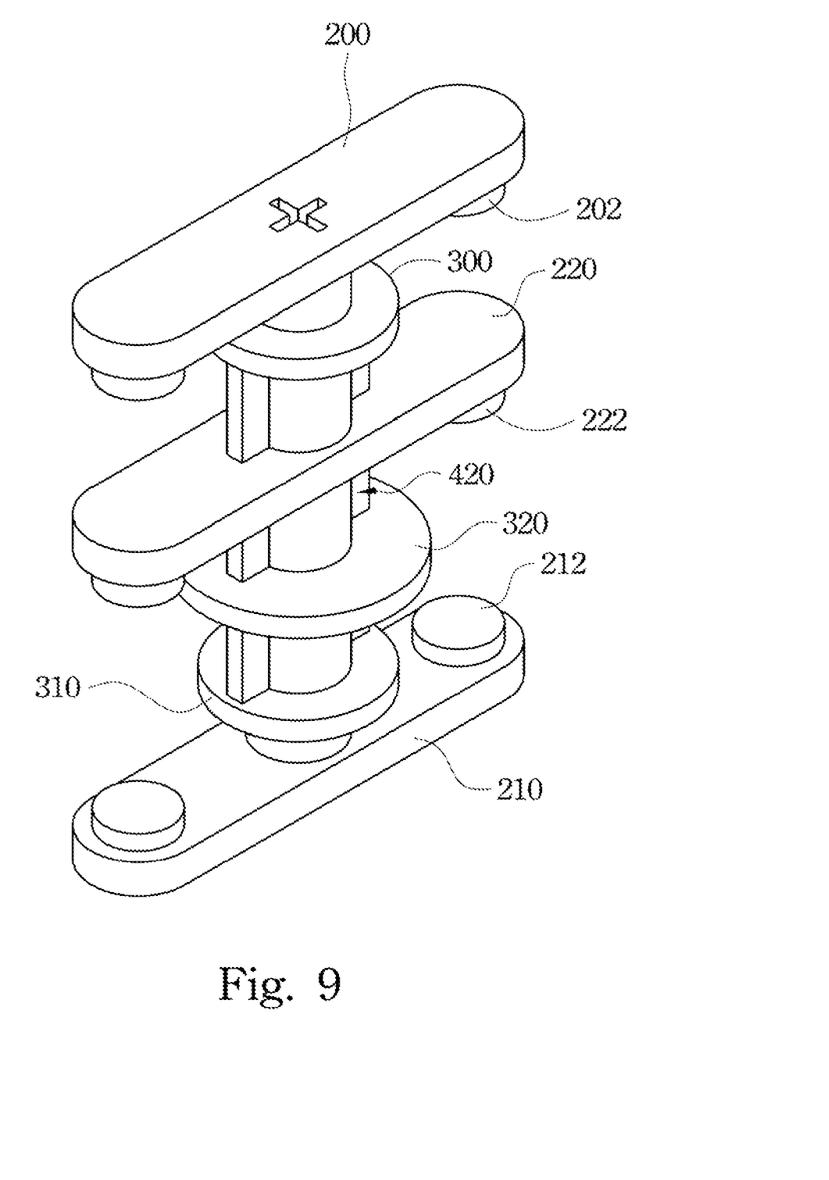
FIG. 9 illustrates a perspective view of a cantilever-type standoff according to still yet another embodiment of the present invention.

FIG. 9 illustrates a perspective view of a cantilever-type standoff according to still yet another embodiment of the present invention. As shown in FIG. 9, the largest difference between the embodiment and FIG. 8 is that this embodiment further includes at least one middle cantilever 220, at least one middle blocking plate 320 and at least one middle bump 222. In this embodiment, the middle cantilever 220 is disposed between the blocking plates 300 and 310. The middle blocking plate 320 is disposed below the middle cantilever 220. At least one middle clamping groove 420 is defined jointly by the middle blocking plate 320 and the middle cantilever 220, for clamping at least one middle substance to be secured (not shown). The middle bump 222 is disposed on a surface of the middle cantilever 220 facing the middle blocking plate 320.

Thus, in addition to clamping the two substances to be secured through the cantilevers 200 and 210, the cantilever-type standoff of this embodiment can further use at least one middle cantilever 220 and at least one middle blocking plate 320 to secure other middle substances to be secured. Thus, the cantilever-type standoff of this embodiment can secure more than three substances to be secured.

Figure 10:
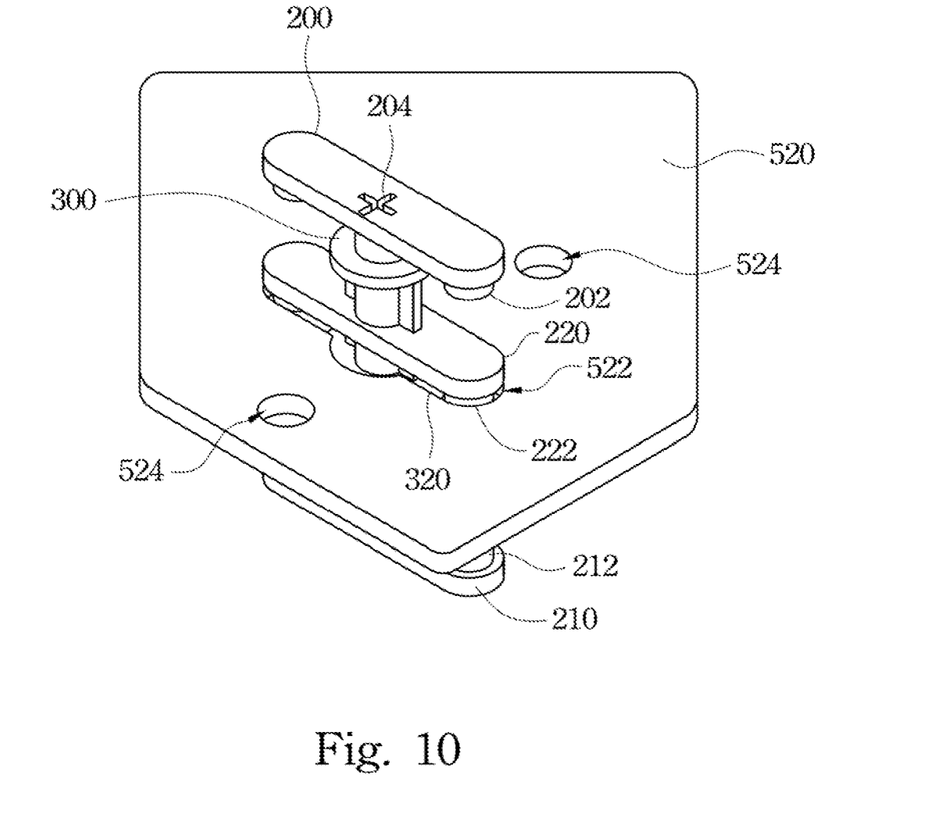
FIGS. 10-12 illustrate perspective views of an operation process of the cantilever-type standoff system according to another embodiment of the present invention.
Figure 11:
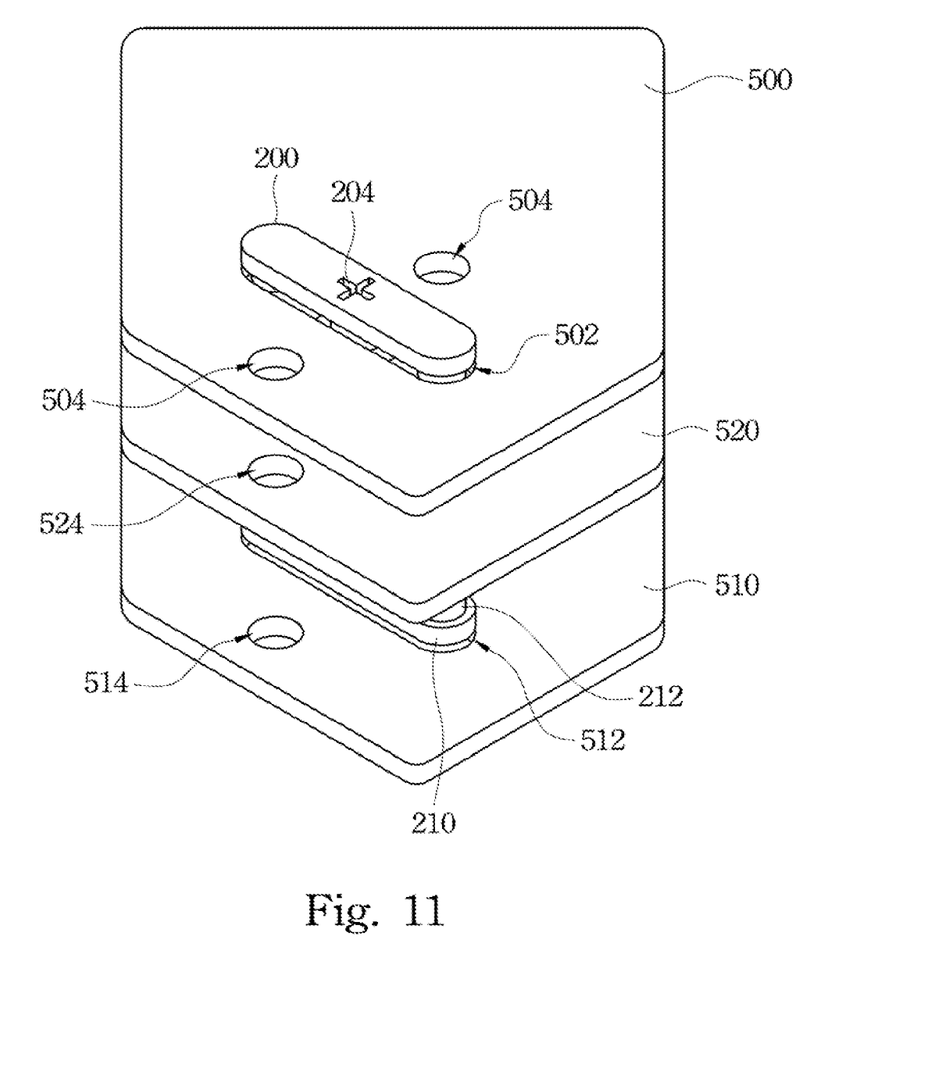
Figure 12:
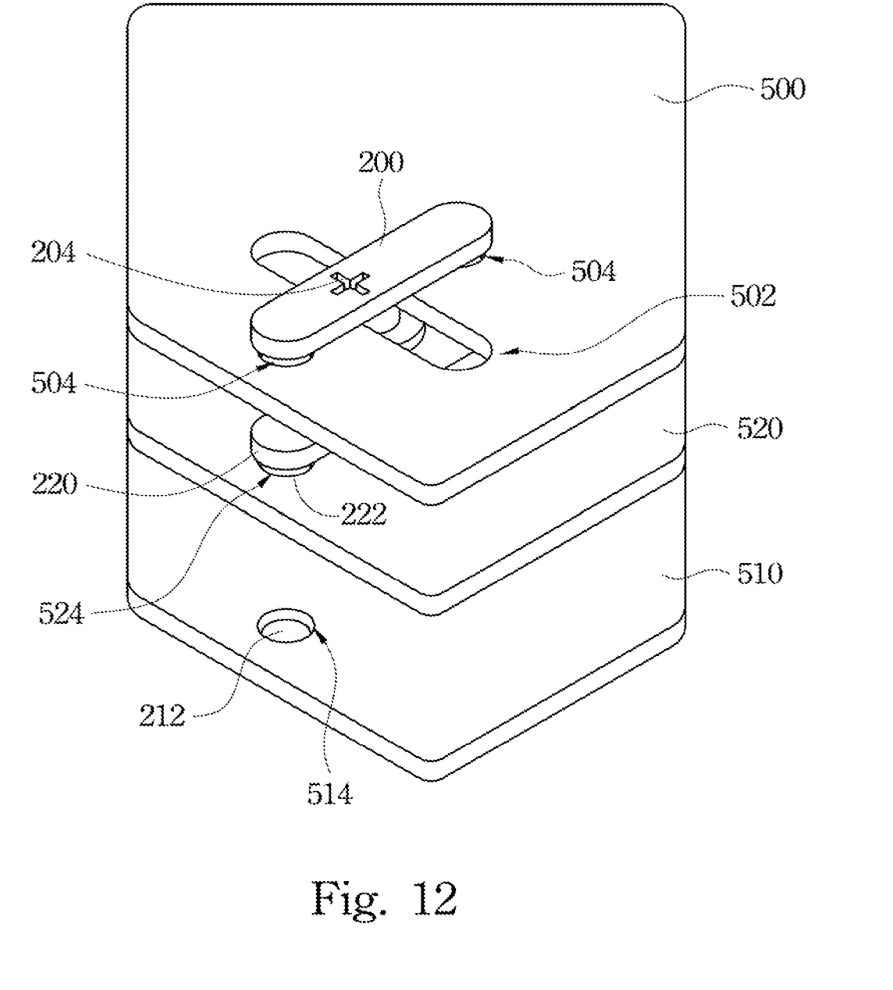

FIGS. 10-12 illustrate perspective views of an operation process of the cantilever-type standoff system according to another embodiment of the present invention. As shown in FIG. 10, the middle substance to be secured 520 may be provided with a middle cantilever hole 522 and a middle bump hole 524. The middle cantilever hole 522 is arranged corresponding to the middle cantilever 220. The middle bump hole 524 is arranged corresponding to the middle bump 222. In some embodiments, the middle cantilever hole 522 has a size slightly larger than the same of the middle cantilever 220, such that the middle cantilever 220 can thread through the middle cantilever hole 522, thereby relatively supporting the middle substance to be secured 520 on the middle blocking plate 320.

In some embodiments, the middle bump hole 524 has a size approximately equal to the same of the middle bump 222, such that the middle bump 222 can be engaged in the middle bump hole 524, for helping securing the middle substance to be secured 520. In some embodiments, the distance between the middle cantilever 220 and the middle blocking plate 320 is approximately equal to the thickness of the middle substance to be secured 520, for helping clamping the middle substance to be secured 520.

In some embodiments, the projected position of the blocking plate 300 on the middle blocking plate 320 is disposed in the middle blocking plate 320 (referring to FIG. 9). That is, the blocking plate 300 has a size smaller than the same of the middle blocking plate 320. The middle cantilever hole 522 has a size larger than the same of the blocking plate 300 but smaller than the same of the middle blocking plate 320. Thus, the middle substance to be secured 520 may encircle the blocking plate 300 through the middle cantilever hole 522 and be supported on the middle blocking plate 320.

In some embodiments, the middle blocking plate 320 may be but not limited to a circular plate. The middle cantilever hole 522 may be but not limited to a strip-shaped hole. The diameter of the middle blocking plate 320 may be larger than the width of the middle cantilever hole 522, such that the middle substance to be secured 520 can be blocked at the middle blocking plate 320.

As shown in FIG. 11, after the middle substance to be secured 520 is supported on the middle blocking plate 320, the substance to be secured 500 may encircle the cantilever 200 through the cantilever hole 502 and be blocked at the blocking plate 300 (referring to FIG. 4). Similarly, the substance to be secured 510 may encircle the cantilever 210 through the cantilever hole 512 and be blocked at the blocking plate 310 (referring to FIG. 4).

As shown in FIG. 12, the cantilever 200 used in this embodiment pivots around the column body 100 (referring to FIG. 9) used as an axis. Thus the cantilever 210 and the middle cantilever 220 connected with the column body 100 (referring to FIG. 9) pivot simultaneously along with the pivoting of the cantilever 200, thereby co-securing the substances to be secured 500, 510 and the middle substance to be secured 520. In particular, the middle cantilever 220 can be made of elastic materials. Thus, when the middle cantilever 220 suffers from a force towards the middle bump hole 524 (referring to FIG. 10), the middle bump 222 moves away from the middle cantilever hole 522 (referring to FIG. 10) due to the elasticity of the middle cantilever 220 and slides along the surface of the middle substance to be secured 520 until touching the middle bump hole 524. Subsequently the middle bump 222 naturally falls into and is engaged in the middle bump hole 524 due to the elasticity of the middle cantilever 220. Meanwhile, due to the co-rotation of the cantilever 210 and the cantilever 200, the substances to be secured 500 and 510 are co-secured.

Figure 13:
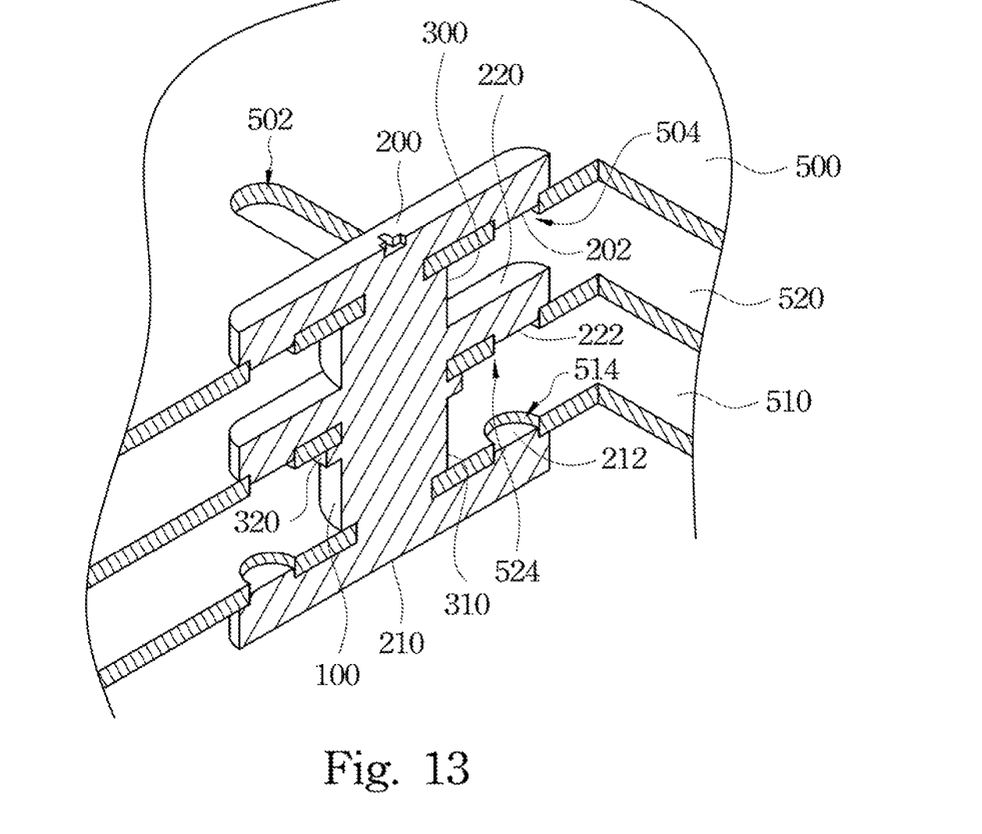
FIG. 13 illustrates a sectional view of the embodiment shown in FIG. 12.

FIG. 13 illustrates a sectional view of the embodiment shown in FIG. 12. As shown in FIG. 13, after the securing is completed, a surface of the middle substance to be secured 520 is pressed by the middle cantilever 220, and the other surface thereof is supported on the blocking plate 320. The end surface of the middle substance to be secured 520 adjacent to the upper and lower surfaces is abutted against the column body 100. The middle bump 222 is engaged in the middle bump hole 524. Thus, the middle substance to be secured 520 can be steadily secured between the column body 100, the middle cantilever 220 and the middle blocking plate 320. Similarly, the substance to be secured 500 is also steadily secured between the column body 100, the cantilever 200 and the blocking plate 300. The substance to be secured 510 is also steadily secured between the column body 100, the cantilever 210 and the blocking plate 310. Thus, in this embodiment the substances to be secured 500, 510 and the middle substance to be secured 520 are co-secured.

In some embodiments, the substances to be secured 500, 510 and the middle substance to be secured 520 may be but not limited to a circuit board or any board-like substance.

Although the present invention has been disclosed with reference to the above embodiments, these embodiments are not intended to limit the present invention. It will be apparent to those of skills in the art that various modifications and variations can be made without departing from the spirit and scope of the present invention. Therefore, the scope of the present invention shall be defined by the appended claims.

What is claimed is:

1. A cantilever-type standoff, comprising:
   a column body;
   a plurality of cantilevers respectively disposed on opposite end surfaces of the column body;
   a plurality of blocking plates respectively parallel to the cantilevers, wherein a plurality of clamping grooves are respectively defined by the blocking plates and the cantilevers; and
   a plurality of bumps respectively disposed on a plurality of surfaces of the cantilevers facing the blocking plates.

2. The cantilever-type standoff of claim 1, wherein the cantilevers are formed by elastic materials.

3. The cantilever-type standoff of claim 1, further comprising:
   a plurality of extension arms respectively extending from the cantilevers.

4. The cantilever-type standoff of claim 3, wherein a plurality of surfaces of the extension arms facing the blocking plates have a plurality of bumps.

5. The cantilever-type standoff of claim 1 further comprising a notch groove formed on one of the cantilevers.

6. The cantilever-type standoff of claim 1, further comprising:
   at least one middle cantilever disposed between the blocking plates;
   at least one middle blocking plate disposed below the middle cantilever, wherein at least one middle clamping groove is defined jointly by the middle blocking plate and the middle cantilever; and
   at least one middle bump disposed on a surface of the middle cantilever facing the middle blocking plate.

7. The cantilever-type standoff of claim 6, wherein the middle cantilever is formed by elastic materials.

8. A cantilever-type standoff system, comprising:
   a cantilever-type standoff, comprising:
      a column body;
      a plurality of cantilevers respectively disposed on opposite end surfaces of the column body;
      a plurality of blocking plates respectively parallel to the cantilevers wherein a plurality of clamping grooves are respectively defined by the blocking plates and the cantilevers; and
      a plurality of bumps respectively disposed on a plurality of surfaces of the cantilevers facing the blocking plates;
   a plurality of substances to be secured respectively clamped by the clamping grooves, each comprising:
      a bump hole having a size approximately equal to the same of the bump; and
      a cantilever hole having a size larger than the same of the cantilever.

9. The cantilever-type standoff system of claim 8, wherein the cantilevers are formed by elastic materials.

10. The cantilever-type standoff system of claim 8, further comprising a plurality of extension arms respectively extending from the cantilevers.

11. The cantilever-type standoff system of claim 8, wherein a plurality of surfaces of the extension arms facing the blocking plates have a plurality of bumps.

12. The cantilever-type standoff system of claim 8, further comprising a notch groove formed on one of the cantilevers.

13. The cantilever-type standoff system of claim 8, further comprising:
   at least one middle cantilever disposed between the blocking plates;
   at least one middle blocking plate disposed below the middle cantilever, wherein at least one middle clamping groove is defined jointly by the middle blocking plate and the middle cantilever: and
   at least one middle bump disposed on a surface of the middle cantilever facing the middle blocking plate.

14. The cantilever-type standoff system of claim 13, further comprising at least one middle substance to be secured clamped by the middle clamping groove, wherein the middle substance to be secured comprises:
   a middle bump hole having a size approximately equal to the same of the middle bump; and
   a middle cantilever hole having a size larger than the same of the middle cantilever;
   wherein, the middle cantilever hole has a size larger than the same of the blocking plates but smaller than the same of the middle blocking plate.

15. The cantilever-type standoff system of claim 13, wherein the middle cantilever is formed by elastic materials.

* * * * *